(12) United States Patent
Kim et al.

(10) Patent No.: US 12,708,010 B2
(45) Date of Patent: Aug. 11, 2026

(54) SEMICONDUCTOR PACKAGE HAVING FIRST PAD AND SECOND PAD

(71) Applicant: SAMSUNG ELECTRONICS CO., LTD., Suwon-si (KR)

(72) Inventors: Juhyeon Kim, Suwon-si (KR); Yeongseon Kim, Suwon-si (KR); Sunkyoung Seo, Suwon-si (KR); Chajea Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 340 days.

(21) Appl. No.: 18/231,102

(22) Filed: Aug. 7, 2023

(65) Prior Publication Data

US 2024/0113057 A1 Apr. 4, 2024

(30) Foreign Application Priority Data

Sep. 30, 2022 (KR) ........................ 10-2022-0124848

(51) Int. Cl.
*H10W 70/685* (2026.01)
*H10W 20/20* (2026.01)
(Continued)

(52) U.S. Cl.
CPC ......... *H10W 70/685* (2026.01); *H10W 20/20* (2026.01); *H10W 70/611* (2026.01); *H10W 72/934* (2026.01); *H10W 90/792* (2026.01)

(58) Field of Classification Search
CPC ....... H01L 2224/08145; H01L 25/0657; H01L 25/105; H01L 25/50; H01L 25/065;
(Continued)

(56) References Cited

U.S. PATENT DOCUMENTS 8,410,615 B2 4/2013 Aoki et al.
9,312,229 B2 4/2016 Chen et al.
(Continued)

FOREIGN PATENT DOCUMENTS

CN 104517921 A 4/2015
KR 10-2019-0011124 A 2/2019
(Continued)

OTHER PUBLICATIONS

Office Action in Korean Appln. No. 10-2022-0124848, mailed on Feb. 2, 2026, 16 pages (with English translation).

*Primary Examiner* — Mamadou L Diallo
(74) *Attorney, Agent, or Firm* — Fish & Richardson P.C.

(57) ABSTRACT

A semiconductor package includes a first semiconductor chip stacked on a second semiconductor chip. The first semiconductor chip includes a first substrate, a first insulating layer on a lower surface of the first substrate, and a first pad exposed through the first insulating layer. The second semiconductor chip includes a second substrate, a second insulating layer on an upper surface of the second substrate contacting the first insulating layer, and a second pad exposed through the second insulating layer contacting the first pad. The first pad has an inclined side surface and a first width that increases toward the first substrate, and the second pad has an inclined side surface and a second width that increases toward the second substrate.

18 Claims, 12 Drawing Sheets

(51) Int. Cl.
*H10W 70/60* (2026.01)
*H10W 72/90* (2026.01)
*H10W 90/00* (2026.01)

(58) Field of Classification Search
CPC ....... H01L 24/08; H01L 23/481; H01L 24/05; H01L 2224/05556; H01L 2224/0903; H01L 2224/80895; H01L 2225/06541; H01L 24/09; H01L 24/04; H01L 23/4824
See application file for complete search history.

(56) References Cited

U.S. PATENT DOCUMENTS 9,437,572 B2 9/2016 Chen et al.
10,256,186 B2 4/2019 Bonilla et al.
10,475,739 B2 11/2019 You et al.
11,127,711 B2 9/2021 Shini
11,152,317 B2 10/2021 Choi et al.
11,244,916 B2 2/2022 Uzoh et al.
2019/0385935 A1 12/2019 Gao et al.
2020/0294962 A1 9/2020 Katz et al.
2021/0066224 A1* 3/2021 Jang .................... H01L 23/3192
2021/0066251 A1 3/2021 Kim
2021/0098423 A1* 4/2021 Chen ....................... H01L 24/08
2021/0296269 A1 9/2021 Sharangpani et al.
2022/0020712 A1 1/2022 Wang et al.
2022/0336394 A1* 10/2022 Ishikawa ................. H01L 24/06
2023/0114550 A1* 4/2023 Kwon ..................... H01L 24/03
438/455
2024/0387484 A1* 11/2024 Chang ..................... H01L 25/18

FOREIGN PATENT DOCUMENTS

KR 10-2021-0072181 A 6/2021
KR 10-2021-0081891 A 7/2021

* cited by examiner 235 231 225 221 233

SEMICONDUCTOR PACKAGE HAVING FIRST PAD AND SECOND PAD

CROSS-REFERENCE TO RELATED APPLICATION

This application claims priority under 35 U.S.C. § 119 to Korean Patent Application No. 10-2022-0124848 filed on Sep. 30, 2022 in the Korean Intellectual Property Office, the subject matter of which is hereby incorporated by reference in its entirety.

BACKGROUND

1. Field

The inventive concept relates generally to semiconductor packages.

2. Description of Related Art

In response to continuing demands for high capacity, high performance, increasingly thin, and increasingly small (or miniaturized) electronic products, a variety of semiconductor packages, and related manufacturing techniques, have been proposed. According to some of these proposed techniques, a relatively greater number of components (e.g., semiconductor chips) may be integrated within a semiconductor package using a direct bonding technology. Direct bonding technologies allow the bonding of one or more semiconductor chips without the use of a nonconductive film (NCF) or a connection bump (e.g., solder ball).

SUMMARY

Embodiments of the inventive concept provide semiconductor packages exhibiting improved reliability.

In one embodiment, the inventive concept provides a semiconductor package including; a first semiconductor chip stacked on a second semiconductor chip, the first semiconductor chip including a first substrate, a first insulating layer on a lower surface of the first substrate, and a first pad exposed through the first insulating layer, and the second semiconductor chip including a second substrate, a second insulating layer on an upper surface of the second substrate contacting the first insulating layer, and a second pad exposed through the second insulating layer contacting the first pad, wherein the first pad has an inclined side surface and a first width that increases toward the first substrate, and the second pad has an inclined side surface and a second width that increases toward the second substrate.

In another embodiment, the inventive concept provides a semiconductor package including; a first semiconductor chip stacked on a second semiconductor chip, the first semiconductor chip including a first substrate, a first wiring structure under the first substrate, a first pad connected to the first wiring structure, and a first insulating layer surrounding the first pad, and the second semiconductor chip including a second substrate, a second wiring structure on the second substrate, a second pad connected to the second wiring structure and contacting the first pad, and a second insulating layer surrounding the second pad and contacting the first insulating layer, wherein an angle formed between a side surface of the first pad and a lower surface of the first pad ranges from about 90° to about 110°, and an angle between a side surface of the second pad and an upper surface of the second pad ranges from about 90° to about 110°.

In still another embodiment, the inventive concept provides a semiconductor package including; a first semiconductor chip stacked on a second semiconductor chip, the first semiconductor chip including a first substrate, a first pad under the first substrate, and a first insulating layer surrounding the first pad, and the second semiconductor chip including a second substrate, a second pad on the second substrate, and a second insulating layer surrounding the second pad and contacting the first insulating layer, wherein the first pad includes a lower surface and an opposing upper surface, the second pad includes an upper surface contacting the lower surface of the first pad and an opposing lower surface, a width of the upper surface of the first pad is greater than a width of the lower surface of the first pad, and a width of the lower surface of the second pad is greater than a width of the upper surface of the second pad.

BRIEF DESCRIPTION OF DRAWINGS

Advantages, benefits, and features, as well as the making and use of the inventive concept, will be more clearly understood upon consideration of from the following detailed description together with the accompanying drawings, in which.

DETAILED DESCRIPTION

Throughout the written description and drawings, like reference numbers and labels are used to denote like or similar elements, components, features and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width/length; vertical/horizontal; top/bottom; higher/lower; closer/farther; thicker/thinner; proximate/distant; above/below; under/over; upper/lower; center/side; surrounding/central; overlay/underlay; etc.

Figure 1:
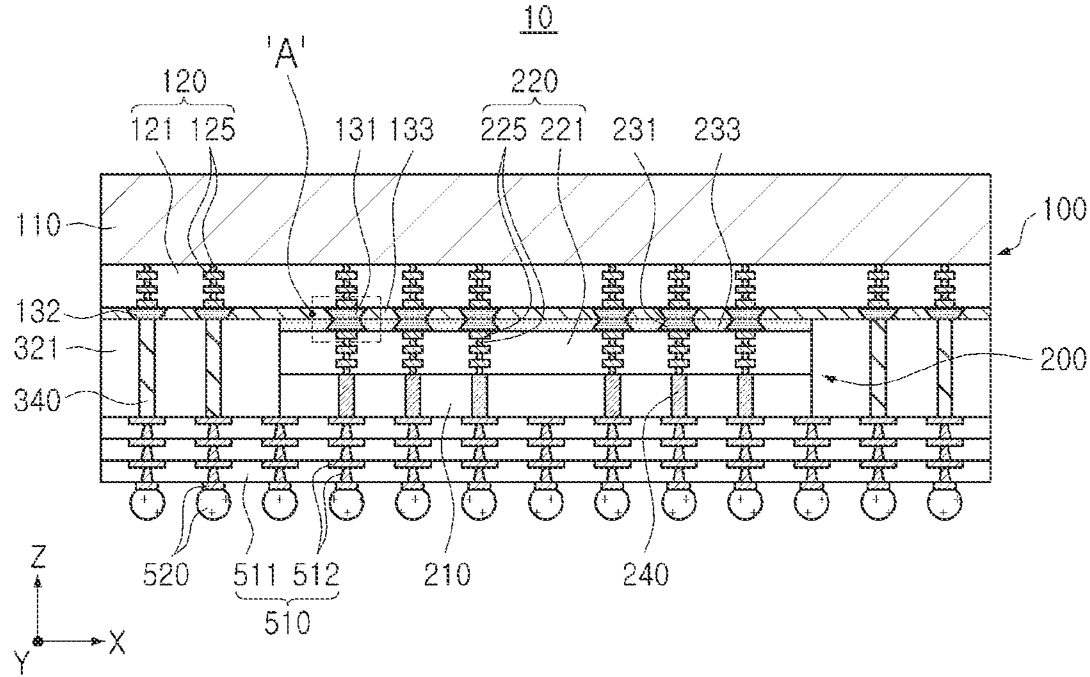
FIG. 1 is a cross-sectional view of a semiconductor package 10 according to embodiments of the inventive concept.

FIG. 1 is a cross-sectional view of a semiconductor package 10 according to embodiments of the inventive concept, and FIGS. 2, 3, 4, 5, 6, and 7 are respective cross-sectional views illustrating various examples (10A, 10B, 10C, 10D, 10E and 10F) of region 'A' indicated in FIG. 1.

Figure 2:
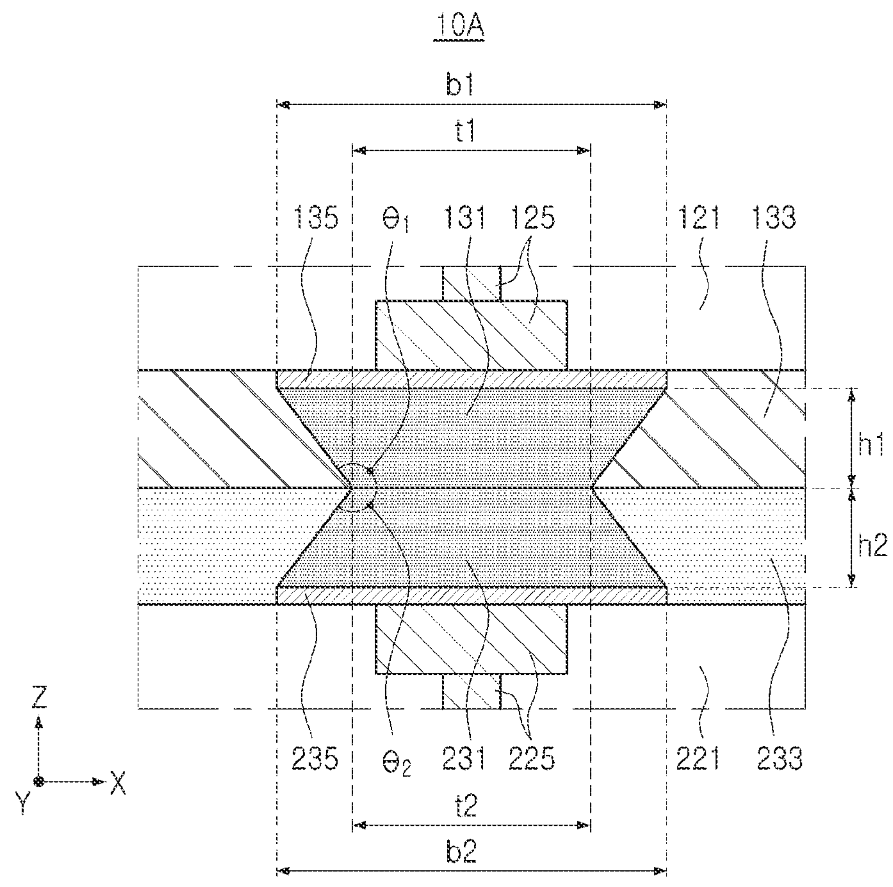
FIGS. 2, 3, 4, 5, 6, and 7 are respective cross-sectional views illustrating various examples (10A, 10B, 10C, 10D, 10E and 10F) of the region 'A' indicated in FIG. 1.

Referring to FIGS. 1 and 2, the semiconductor package 10 may include multiple semiconductor chips stacked in a third (or a Z) direction. That is, a first semiconductor chip 100 may be stacked on a second semiconductor chip 200. In this configuration, a lower surface of the first semiconductor chip 100 and an upper surface of the second semiconductor chip chip 200 may be directly bonded together. In this regard, the term "direct" (as in "directly") denotes a relationship wherein one element (e.g., the lower surface of the first semiconductor chip 100) is coupled or bonded to another element (e.g., the upper surface of the second semiconductor chip 200) without the use of an intervening element or component (e.g., a metal bump).

A first insulating layer 133 is provided on the lower surface of the first semiconductor chip 100, and at least a lower surface of a first pad 131 may be exposed through the first insulating layer 133. The exposed lower surface of the first pad 131 may be used as a bonding surface for an upper surface of a second bonding pad 131 exposed though an upper surface of a second insulating layer 233 provided on an upper surface of the second semiconductor chip 200. With this configuration, the first semiconductor chip 100 may be electrically connected to the second semiconductor chip 200 through a bonding pad structure including the first pad 131 and the second pad 231.

According to the embodiment illustrated in FIGS. 1 and 2, the first pad 131 and the second pad 231 may each have a beveled shape in which a width (e.g., a dimension measured in the first (or X) direction) of the pad increases as the pad extends away from its exposed surface (e.g., the exposed lower surface of the first pad 131 and the exposed upper surface of the second pad 231). Stated in other relative terms, the width of the first pad 131 increases as the first pad 131 extends toward an associated first substrate 110, and the width of the second pad 231 increases as the second pad 231 extends toward an associated second substrate 210. In this regard, it is the exposed lower surface of the first pad 131 and the exposed upper surface of the second pad 231 that are bonded together to increase the overall "volume" of the resulting bonding pad structure. (The importance of pad volume will be described in some additional detail hereafter). In this manner, the semiconductor package 10 of FIG. 1 exhibits improved reliability due to the nature of the bonding pad structure of FIG. 2.

Referring to FIGS. 1 and 2, the semiconductor package 10 may include an outer insulating layer 321, a vertical connection structure 340, a redistribution structure 510, and bump structures 520, as well as the first semiconductor chip 100 and the second semiconductor chip 200.

The first semiconductor chip 100 may include the first substrate 110, a first circuit layer 120, the first pad 131, a connection pad 132, and the first insulating layer 133. The first semiconductor chip 100 may have a substantially flat lower surface. Various first pad(s) 131 and connection pad(s) 132 may be exposed through the first insulating layer 133 formed on the lower surface of the first semiconductor chip 100.

The first substrate 110 may be a semiconductor wafer including one or more semiconductor element(s), such as silicon and germanium, and/or a compound semiconductor, such as silicon carbide (SiC), gallium arsenide (GaAs), indium arsenide (InAs), and indium phosphide (InP). The lower surface of the first substrate 110 may be an active surface (e.g., a surface associated with the first circuit layer 120) having active region(s) variously doped with impurities. Accordingly, the opposing upper surface of the first substrate 110 may be an inactive surface.

The first circuit layer 120 disposed on the lower surface of the first substrate 110 and may include a first interlayer insulating layer 121 and a first wiring structure 125. The first interlayer insulating layer 121 may include, at least one of, for example; Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX) and Flowable CVD (FCVD) oxide. At least a portion of the first interlayer insulating layer 121 surrounding the first wiring structure 125 may be formed using a low dielectric layer. The first interlayer insulating layer 121 may be formed using at least one of a chemical vapor deposition (CVD) process, a flowable-CVD process, and a spin coating process.

The first wiring structure 125 may be formed in a multi-layer structure including wiring patterns and vias, formed from at least one of, for example; aluminum (Al), gold (Au), cobalt (Co), copper (Cu), nickel (Ni), lead (Pb), tantalum (Ta), tellurium (Te), titanium (Ti) and tungsten (W). A barrier film (not shown) including at least one of, for example; titanium (Ti), titanium nitride (TiN), tantalum (Ta), and tantalum nitride (TaN) may be disposed between the wiring patterns or/and vias and the first interlayer insulating layer 121. Various elements and components associated with one or more integrated circuit(s) may be disposed on the lower (or active) surface of the first substrate 110. Accordingly, the first wiring structure 125 may be used to electrically connect to these various elements and components. Exemplary elements and components include; e.g., field effect transistors (FETs), planar FETs, FinFETs, semiconductor chips variously implementing flash memory, Dynamic Random Access Memory (RAM) (DRAM) chips, Synchronous RAM (SRAM), Electrically Eraseable Programmable Read-Only-Memory (ROM) (EEPROM), Phase-programmable RAM (PRAM), Magnetic RAM (MRAM), Ferroelectric Ram (FeRAM), and Resistance RAM (RRAM), semiconductor chips variously implementing logic devices, such as AND, NAND, OR, and NOR logic, as well as active elements and/or passive elements routinely associated with Large Scale Integration (LSI) devices, Contact Image Sensor (CIS) devices, and Micro Electro Mechanical Systems (EMS).

In some embodiments like the one illustrated in FIG. 2, a first seed layer 135 may be disposed between the lower surface of the semiconductor chip 100 and the first pad 131. Hence, an upper surface of the first pad 131 may contact the first seed layer 135, and a side surface of the first pad 131 may contact the first insulating layer 133. Thus, the upper surface of the first seed layer 135 may contact a lower surface of the first wiring structure 125, the lower surface of the first seed layer 135 may contact the upper surface of the first pad 131, and a side surface of the first seed layer 135 may be substantially surrounded by the first insulating layer 133. The lower surface of the first seed layer 135 may be disposed at substantially the same level as the upper surface of the first pad 131. (In this context, the term "level" denotes a distance (measured e.g., in the vertical (or Z) direction) from an arbitrarily selected horizontal surface (e.g., the lower surface of the first substrate 110). The width of the upper surface of the first pad 131 may have substantially the same as the width of the upper surface of the first seed layer 135.

The first pads 131 (as well as the connection pads 132) may variously serve as electrical connection terminals associated with the first wiring structure 125 of the first circuit layer 120. Respective first pads 131 and connection pads 132 may include at least one of, for example, copper (Cu), nickel (Ni), titanium (Ti), aluminum (Al), gold (Au), and silver (Ag).

The first pads 131 may be understood as vertically overlaying the second semiconductor chip 200, whereas the connection pads 132 do not vertically overlay the second semiconductor chip 200. The first pads 131 may be used to respectively form a bonding surface between the first semiconductor chip 100 and the second semiconductor chip 200 together with the first insulating layer 133. Accordingly, side surfaces of the first pads 131 and the connection pads 132 may be covered by the first insulating layer 133.

In some embodiments, the first pads 131 and the connection pads 132 may each have a substantially trapezoidal shape.

Accordingly, each first pad 131 bonded to a corresponding second pad 231 may be understood as forming a bonding pad structure. Before the first pad 131 is bonded to the second pad 231, it may be understood as having a slightly concave shape facing (or opening toward) the first substrate 110. However, in order for the first pad 131 to be effectively bonded to the second pad 231, the first pad 131 may have to swell toward the second substrate 210 forming a slightly convex shape. As the amount of swelling associated with the first pad 131 increases, it may be increasingly advantageous to securing a quality bonding. In this regard, the amount of swelling associated with the first pad 131 may be largely influenced by two factors (1) the bonding process temperature and (2) the bonding pad structure volume.

This being the case, there are notable limits to an acceptable range of bonding process temperatures due to various thermal characteristic problems associated with the overall device. Accordingly, in order to practically increase the swelling of the first pad 131, pad volume should be increased. And in order to increase the pad volume, it may be necessary to increase the related bonding area. However, given the demands for semiconductor devices having reduced overall size, there are design drivers against increasing bonding area as an approach to increasing pad volume.

Certain comparative bonding pads are characterized by a width that decreases as a function of distance away from the bonding surface. In contrast, the first pad 131 of FIGS. 1 and 2 is characterized by a width that increases as a function of distance away from the bonding surface. Accordingly, the volume of the pad may be increased while maintaining substantially the same bonding area.

Accordingly, the first pad 131 may be understood as having a beveled (or inclined) side surface configured such that the (first) width of the first pad 131 increases toward the first substrate 110. For example, in some embodiments, an angle formed between a side surface of the first pad 131 and a lower surface of the first pad 131 may range from between about 90° to about 110°. An angle between the side surface of the first pad 131 and the lower surface of the first seed layer 135 may range from between about 70° and about 90°.

The width b1 of the upper surface of the first pad 131 may be greater than the width t1 of the lower surface of the first pad 131. For example, the width b1 of the upper surface of the first pad 131 may range from between about 1.2 um to about 12 um, and the width t1 of the lower surface of the first pad 131 may range from about 1 um to about 10 um. The height (measured e.g., in the third or Z direction) of the first pad 131 may range from about 0.5 um to about 2 um.

The connection pad(s) 132 may be formed using substantially the same manufacturing method used to fabricate the first pad(s) 131 and may have substantially the same structure as the first pad(s) 131. That is, the connection pad(s) 132 may have an inclined (or beveled) side surfaces and be characterized by a width that increases in a direction toward the first substrate 110.

The first insulating layer 133 may be disposed under the first circuit layer 120 to substantially surround the first pad(s) 131 and the connection pad(s) 132. The first insulating layer 133 may include at least one material capable of being bonded to the second insulating layer 233 of the second semiconductor chip 200, such as for example; silicon oxide (SiO) and silicon carbonitride (SiCN). That is, at least some portion(s) of the first insulating layer 133 may be directly bonded to the second insulating layer 233 to form a bonding surface between the first semiconductor chip 100 and the second semiconductor chip 200.

The second semiconductor chip 200 disposed under the first semiconductor chip 100 may include in addition to the second substrate 210, a second circuit layer 220, the second pad(s) 231, and a second insulating layer 233, and through electrodes 240. Here, the upper surface of the second semiconductor chip 200 exposing the second pad(s) 231 through the second insulating layer 233 may be substantially flat in order to effectively contact and bond with the lower surface of the first semiconductor chip 100.

In some embodiments, a number (e.g., greater than 1) of second semiconductor chips 200 may be variously arranged in one or more horizontal planes under the first semiconductor chip 100. Alternately or additionally, a number of second semiconductor chips 200 may be vertically stacked under the first semiconductor chip 100.

In some embodiments, the second semiconductor chip(s) 200 may have substantially the same structure as the first semiconductor chip 100. That is, in some embodiments, the second substrate 210 and the second circuit layer 220 may be substantially similar to the first substrate 110 and the first circuit layer 120, respectively. And consistent with the foregoing description various elements and/or components may be associated with the second substrate 210 and the second circuit layer 220.

The second pads 231 may be connection terminals electrically connected to the second wiring structure 225 of the second circuit layer 220. Each of the second pads 231 may include at least one of, for example; copper (Cu), nickel (Ni), titanium (Ti), aluminum (Al), gold (Au), and silver (Ag). The second pads 231 may be disposed to vertically overlap the first semiconductor chip 100. The second pads 231 may be selectively formed in a bonding surface between the first semiconductor chip 100 and the second semiconductor chip 200 together with the second insulating layer 233. Accordingly, side surfaces of the second pads 231 may be substantially covered by the second insulating layer 233.

Here, in some embodiments, each second pad 231 may have a trapezoidal shape.

Consistent with the forgoing description, the second pad 231 may be respectively bonded to the first pad 131 to form a bonding pad structure. Before the second pad 231 is bonded to the first pad 131, the second pad 231 may have a concave shape toward the second substrate 210. In order to ensure that the second pad 231 is effectively bonded to the first pad 131, the second pad 231 should swell into a convex shape toward the first substrate 110. Here again, swelling of the second pad 231 is advantageous to securing a quality bond. And like the first pads 131 previously described, the swelling of the second pad 231 is largely related to (1) the bonding process temperature and (2) the pad volume. Accordingly, increasing the volume of the second pads 231 may increase swelling while maintaining essentially the same bonding area.

In some embodiments, the second pad 231 may have an inclined (or beveled) side surface, such that the (second) width of the second pad 231 increases toward the second substrate 210. For example, an angle formed between a side surface of the second pad 231 and an upper surface of the second pad 231 may range from between about 90° to about 110°. An angle between the side surface of the second pad 231 and the upper surface of the second seed layer 235 may range from between about 70° and about 90°. The width b2 of the lower surface of the second pad 231 may be greater than the width t2 of the upper surface of the second pad 231. For example, the width b2 of the lower surface of the second pad 231 may range from between about 1.2 um to about 12 um, and the width t2 of the upper surface of the second pad 231 may range from between about 1 um to about 10 um. The height of the second pad 231 may range from between about 0.5 um to about 2 um.

A second seed layer 235 may be disposed under the second pad 231. Thus, a lower surface of the second pad 231 may contact the second seed layer 235, and a side surface of the second pad 231 may contact the second insulating layer 233. The lower surface of the second seed layer 235 may contact the upper surface of the second wiring structure 225, the upper surface of the second seed layer 235 may contact the lower surface of the second pad 231, and the side surface of the second seed layer 235 may be substantially surrounded by the second insulating layer 233. An upper surface of the second seed layer 235 may be disposed substantially the same level as a lower surface of the second pad 231. The width of the lower surface of the second pad 231 may be substantially the same as the width of the lower surface of the second seed layer 235.

The second insulating layer 233 may be disposed on the second circuit layer 220 to surround the second pad 231. The second insulating layer 233 may include at least one material capable of being bonded to (or materially combined with) the first insulating layer 133, such as for example; silicon oxide (SiO) and silicon carbonitride (SiCN).

The through electrodes 240 may extend (or penetrate) through the second substrate 210 to electrically connect the second pad(s) 231 to at least some portion of the conductive structure 512. The through electrodes 240 may be electrically and variously connected to the first pad(s) 131 through the second pad(s) 231. The through electrodes 240 may include via plugs (not shown) and side barrier layers (not shown) surrounding side surfaces of the via plugs. The via plug may include at least one of, for example; tungsten (W), titanium (Ti), aluminum (Al), and copper (Cu), and may be formed using at least one of a plating process, a PVD process, and a CVD process. The side barrier layer may include at least one of for example: titanium (Ti), titanium nitride (TiN), tantalum (Ta), and tantalum nitride (TaN), and may be formed using at least one of a plating process, a PVD process, or a CVD process. A side insulating layer (not shown) including at least one insulating material (e.g., high aspect ratio process (HARP) oxide, silicon oxide, silicon nitride, and silicon oxynitride) may be formed between the side barrier layer and the second substrate 210.

The outer insulating layer 321 may be disposed on the redistribution structure 510 to substantially surround the vertical connection structure 340 and the second semiconductor chip 200. The outer insulating layer 321 may include at least one of for example; a Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX) and Flowable CVD (FCVD) oxide. The outer insulating layer 321 may be formed using a least one of a CVD process, a flowable-CVD process, and a spin coating process.

The vertical connection structure 340 may be disposed between the connection pads 132 and the redistribution structure 510. For example, an upper surface of the vertical connection structure 340 may contact a lower surface of a connection pad 132, and a lower surface of the vertical connection structure 340 may contact an upper surface of a conductive structure 512. In this manner, the vertical connection structure 340 may form an electrical path penetrating the outer insulating layer 321. The vertical connection structure 340 may include a conductive material. The vertical connection structure 340 may be completely filled with a conductive material, and may have, for example, a cylindrical column shape or a polygonal column shape. However, the shape of the vertical connection structure 340 is not particularly limited to only these examples. The vertical connection structure 340 may variously connect the connection pads 132 and the conductive structure 512. In some embodiments, the vertical connection structure 340 may electrically connect the first wiring structure 125 through the connection pad 132, and also electrically connect the bump structures 520 through the conductive structure 512.

The redistribution structure 510 may be disposed under the second semiconductor chip 200, the outer insulating layer 321, and the vertical connection structure 340, and may include an insulating material layer 511 and a conductive structure 512. The insulating material layer 511 may include at least one dielectric material, such as for example; silicon oxide, silicon nitride, silicon oxynitride, and a photosensitive resin such as Photo-Imageable Dielectric (PID). The conductive structure 512 may be electrically connected to the second semiconductor chip 200, and may include at least one conductive material such as for example; copper (Cu), aluminum (Al), silver (Ag), tin (Sn), gold (Au), nickel (Ni), lead (Pb) and titanium (Ti). The conductive structure 512 may include, for example, a ground pattern, a power pattern, and/or a signal pattern, wherein the signal pattern includes conductive patterns and/or vias capable of communicating (e.g., transmitting and/or receiving) a data signal, an address signal and/or a control signal from a combination of the first semiconductor chip 100 and the second semiconductor chip(s) 200 to an external circuit.

The bump structures 520 may be electrically connected to the through electrodes 240 and the vertical connection structure 340 under the second semiconductor chip 200. For example, the bump structures 520 may be disposed under the redistribution structure 510 and electrically connected to the through electrodes 240 and the vertical connection structure 340 through the conductive structure 512. The bump structures 520 may be conductive structures such as for example; solder balls, solder bumps, and metal posts.

Hereafter, additional examples (10B, 10C, 10D, 10E and 10F) of region A indicated in FIG. 1 will be described principally in relation to difference(s) between the additional examples and the example 10A of FIG. 2.

Figure 3:
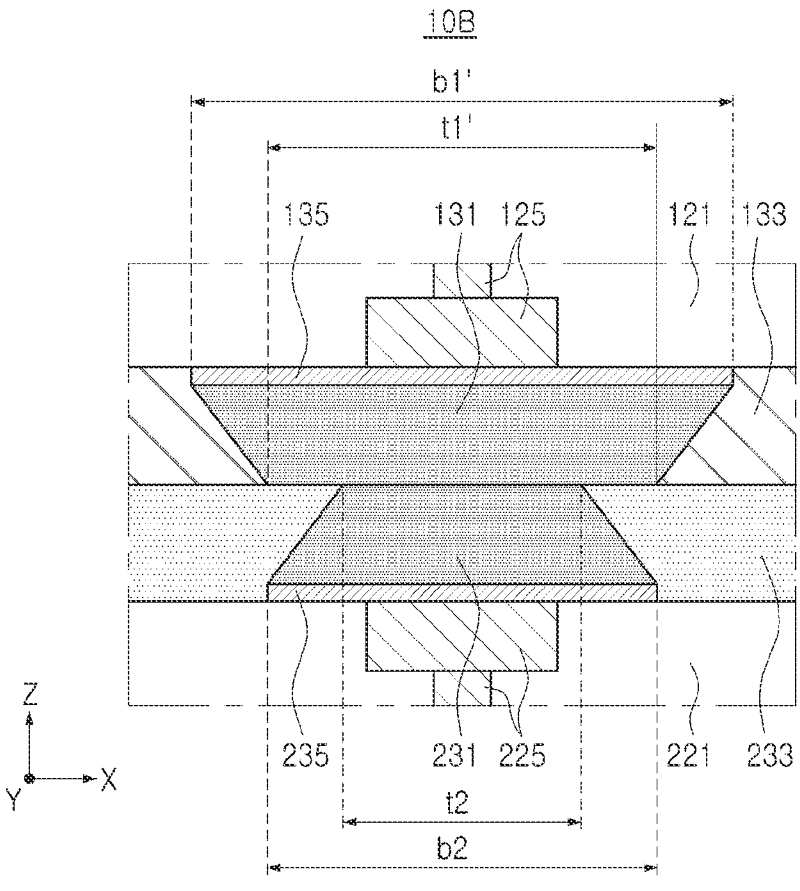

Referring to example 10B of FIG. 3 and in contrast to the example 10A of FIG. 2, in some embodiments of the inventive concept, the width t1' of the lower surface of the first pad 131 may be greater than the width t2 of the upper surface of the second pad 231. In addition, the width b1' of the upper surface of the first pad 131 may be greater than the width b2 of the lower surface of the second pad 231.

Figure 4:
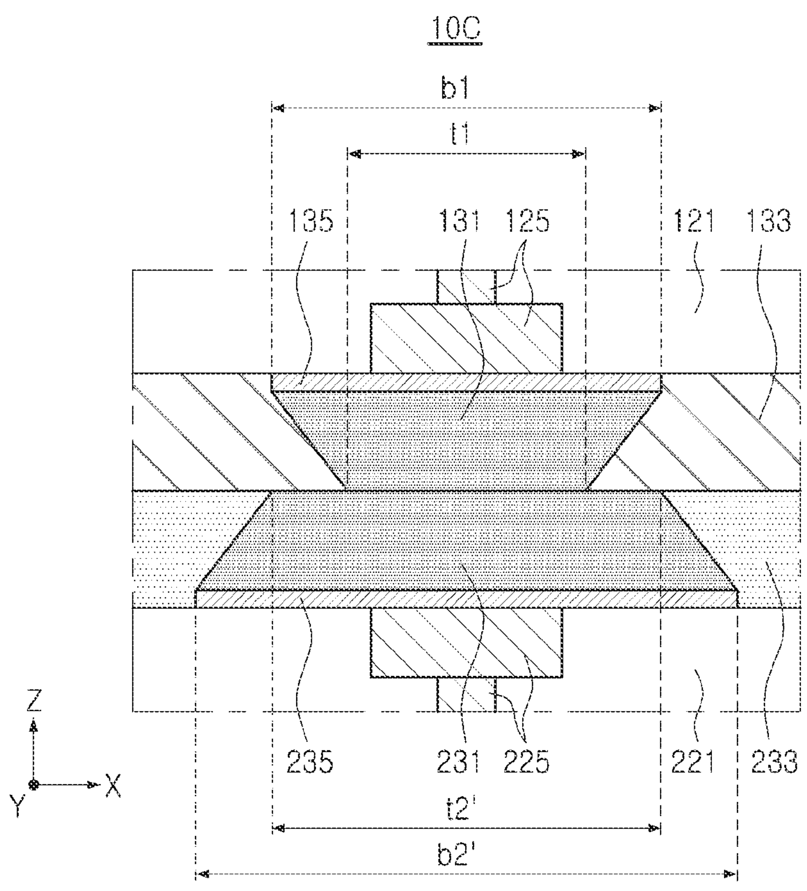

Referring to example 10C of FIG. 4 and in contrast to the example 10A of FIG. 2, in some embodiments of the inventive concept, the width t1' of the lower surface of the first pad 131 may be less than the width t2 of the upper surface of the second pad 231. In addition, the width b1' of the upper surface of the first pad 131 may be less than the width b2 of the lower surface of the second pad 231.

Figure 5:
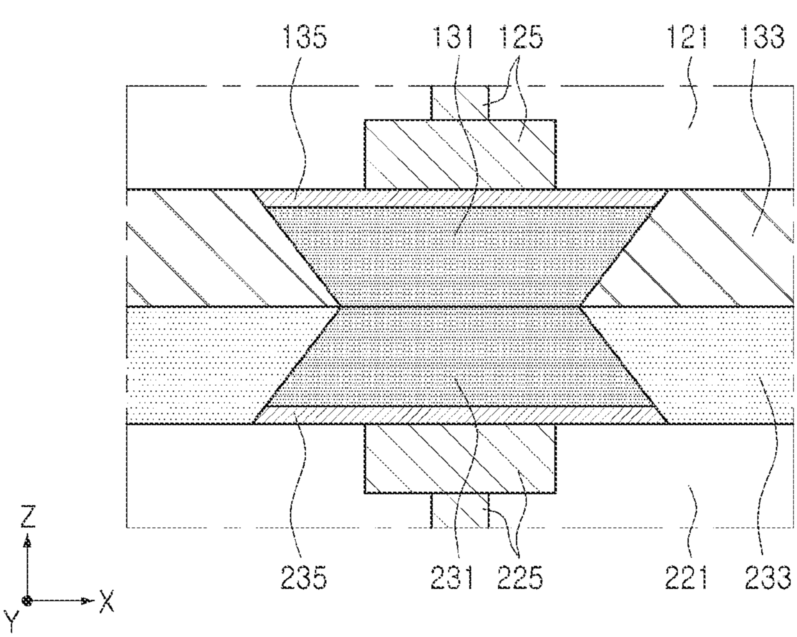

Referring to example 10D of FIG. 5 and in contrast to the example 10A of FIG. 2, in some embodiments of the inventive concept, the first seed layer 135 may have an inclined side surface, such that the width of the first seed layer 135 increases in a direction toward the first substrate 110. Thus, the width of the upper surface of the first seed layer 135 may be greater than the width of the upper surface of the first pad 131. The second seed layer 235 may also have an inclined side surface, such that the width of the second seed layer 235 increases toward the second substrate 210. Hence, a width of the lower surface of the second seed layer 235 may be greater than the width of the lower surface of the second pad 231.

Figure 6:
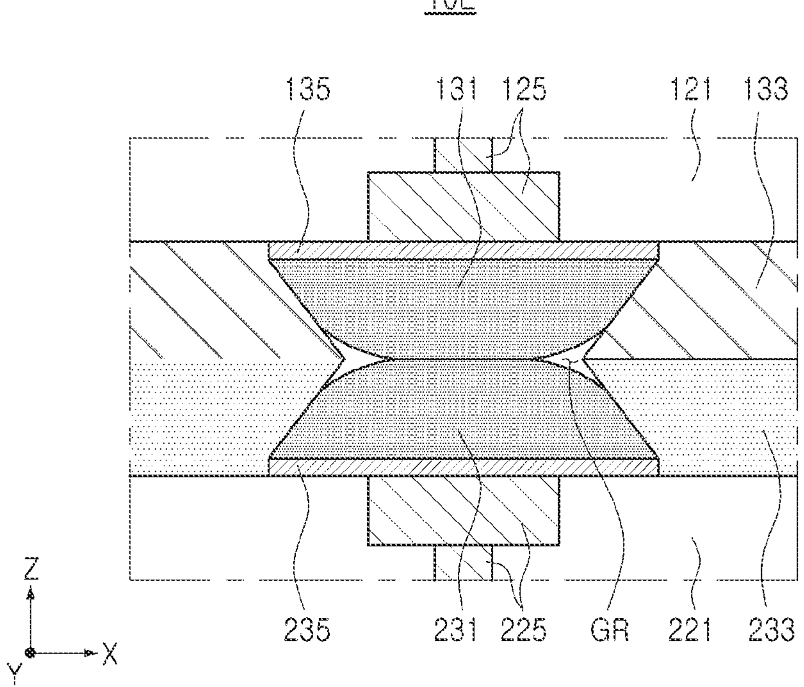

Referring to example 10E of FIG. 6 and in contrast to the example 10A of FIG. 2, in some embodiments of the inventive concept, the lower surface of the first pad 131 having a substantially convex shape extending (or downward-facing) toward the second substrate 210, and the upper surface of the second pad 231 having a substantially convex shape extending (or upward-facing) toward the first substrate 110. Accordingly, a groove GR may be formed outside a first bonding portion in which the first pad 131 and the second pad 231 contact each other and within a second bonding portion in which the first insulating layer 133 and the second insulating layer 233 come into contact. Thus, the groove GR may horizontally overlap both the first insulating layer 133 and the second insulating layer 233.

Figure 7:
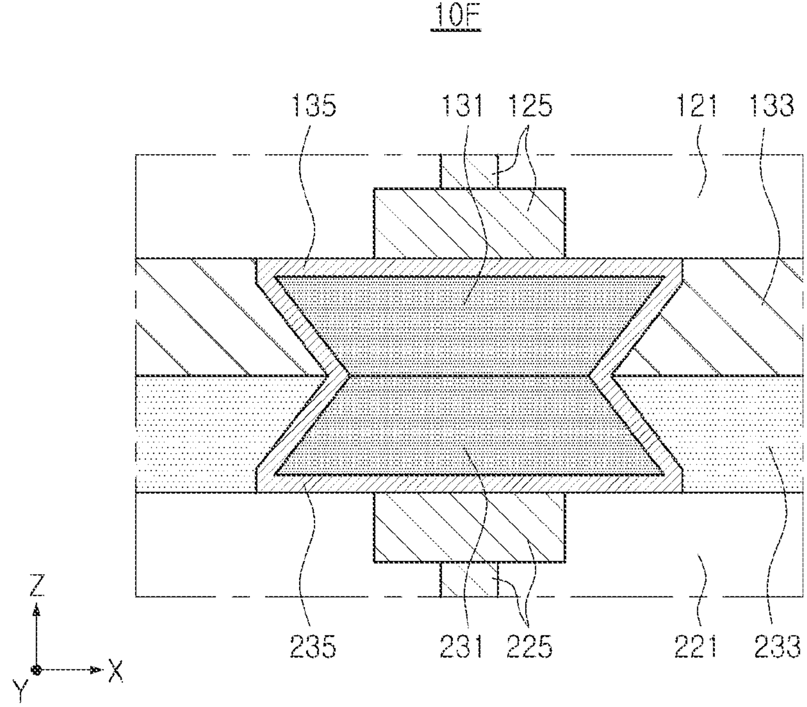

Referring to example 10F of FIG. 7 and in contrast to the example 10A of FIG. 2, in some embodiments of the inventive concept, the first seed layer 135 may cover upper and side surfaces of the first pad 131. Accordingly, the side surface of the first pad 131 may contact the first seed layer 135 without contacting the first insulating layer 133. Similarly, the second seed layer 235 may cover lower and side surfaces of the second pad 231. Accordingly, the side surface of the second pad 231 may contact the second seed layer 235 without contacting the second insulating layer 233.

FIGS. 8A to 8K are related cross-sectional views illustrating in one example a method of manufacturing a semiconductor package according to embodiments of the inventive concept. Each of the FIGS. 8A to 8K may be compared with example 10A of FIG. 2.

Figure 8A:
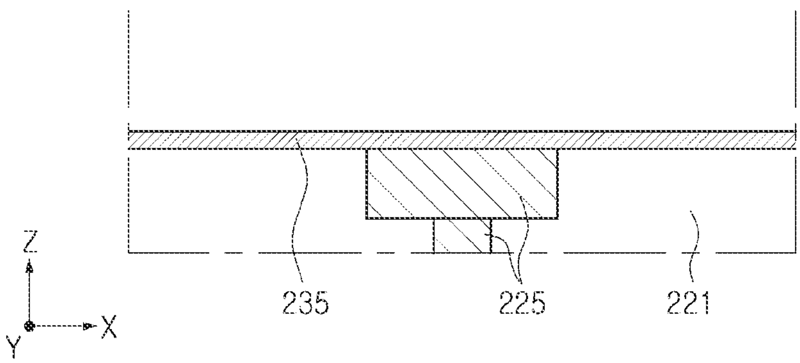
FIGS. 8A, 8B, 8C, 8D, 8E, 8F, 8G, 8H, 8I, 8J and 8K (hereafter collectively, "FIGS. 8A to 8K") are related cross-sectional views illustrating in one example a method of manufacturing a semiconductor package according to embodiments of the inventive concept.

Referring to FIG. 8A, the second seed layer 235 is first formed. The second seed layer 235 may be formed on the second wiring structure (225 in FIG. 2). The second seed layer 235 may include copper. The second seed layer 235 may be formed, for example, using an atomic layer deposition (ALD).

Figure 8B:
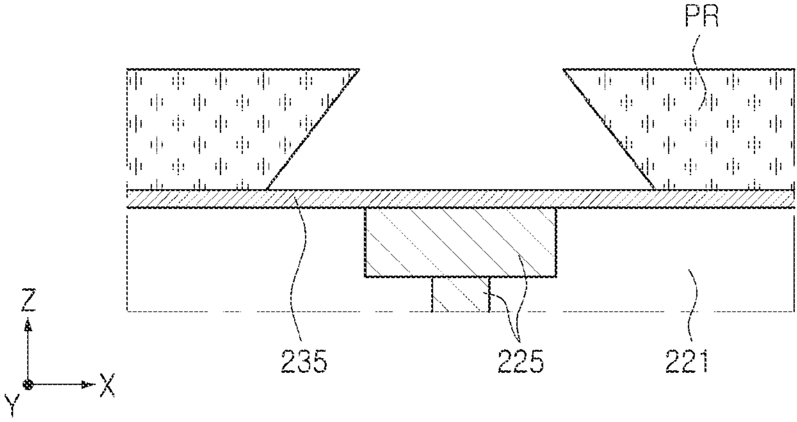

Referring to FIG. 8B, a photoresist pattern PR having an opening vertically overlapping the second wiring structure (225 of FIG. 2) may be formed. The photoresist pattern PR may be formed using a combination of conventionally-understood methods steps, such as photoresist layer formation, exposure, and development. The photoresist pattern PR may include an opening defining a position at which the second pad 231 will be formed. For example, the photoresist pattern PR may be of a negative type in which a portion not exposed to light in an exposure process is removed by a developer. In a case using the negative type photoresist pattern PR, the opening of the photoresist pattern PR may have an inclined side surface that becomes wider toward the bottom.

Figure 8C:
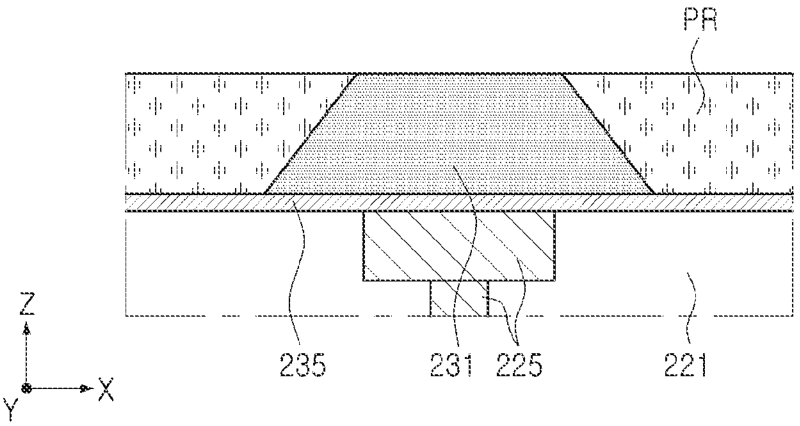

Referring to FIG. 8C, the second pad 231 may be formed by electroplating using the second seed layer 235 as a seed. Since the second seed layer 235 includes the same material as the second pad 231, a boundary surface thereof may not be observed. For example, the second seed layer 235 and the second pad 231 may be integrally connected.

Figure 8D:
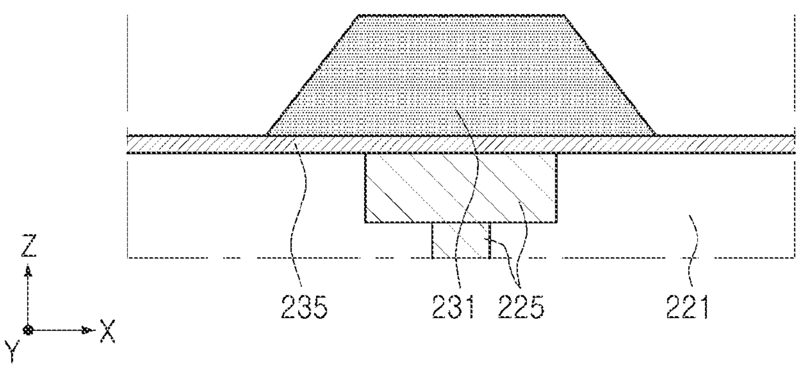

Referring to FIG. 8D, the photoresist pattern PR may be removed. As a result, the side surface of the second pad 231 may be exposed.

Figures 8E, 8F:
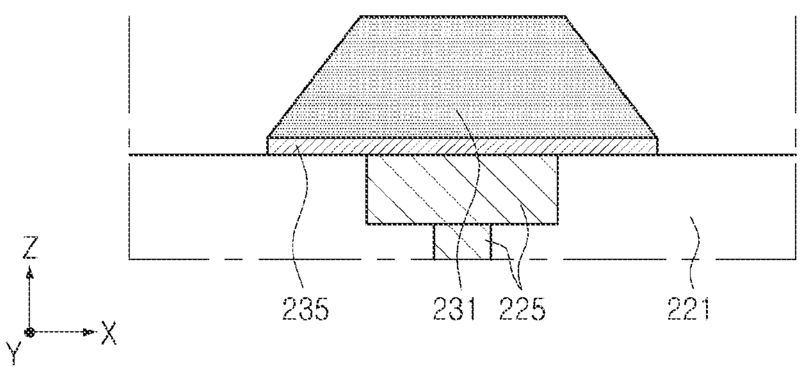

Referring to FIG. 8E, an etching process of the second seed layer 235 may be performed except for a portion vertically overlapping with the second pad 231. The etching process may be, for example, a wet etching process.

Referring to FIG. 8F, a second insulating layer 233 may be formed on the second pad 231. The second insulating layer 233 may be formed using, for example, a CVD process. The second insulating layer 233 may be formed to cover upper and side surfaces of the second pad 231. The second insulating layer 233 may contact upper and side surfaces of the second pad 231.

Figure 8G:
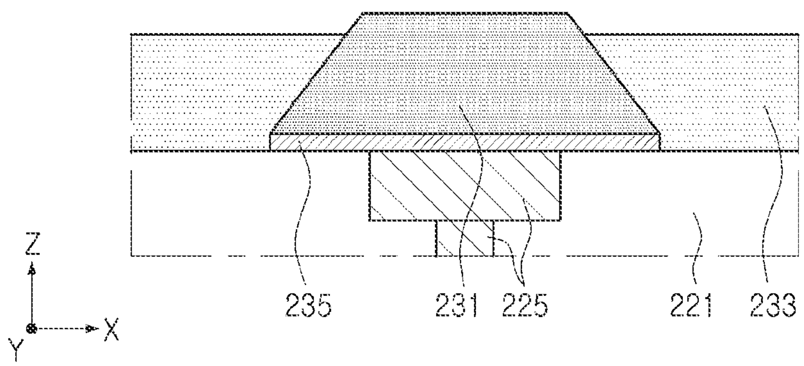

Referring to FIG. 8G, a planarization process may be performed on the surface of the second insulating layer 233. The planarization process may be, for example, a Chemical Mechanical Planarization (CMP) process. The planarization process may be performed until the upper surface of the second pad 231 is exposed. When the planarization process is completed, the upper surface of the second insulating layer 233 may be located at a level lower than a level of the upper surface of the second pad 231.

Figure 8H:
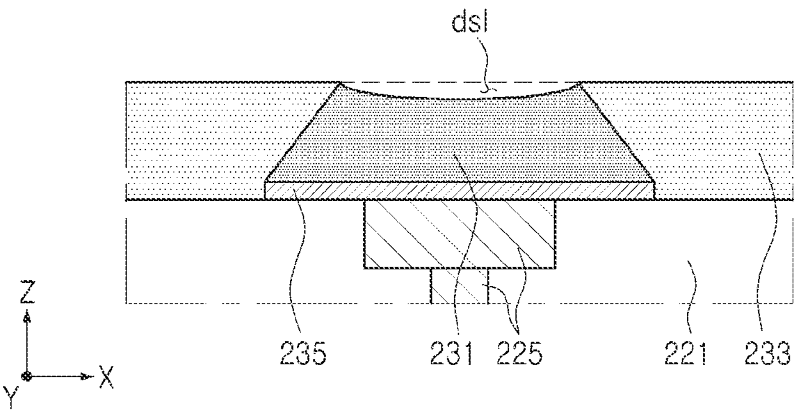

Referring to FIG. 8H, a planarization process may be performed on the surface of the second pad 231. The planarization process may be, for example, a CMP process. The planarization process may be performed until the protruding portion of the second pad 231 protruding upwardly of the second insulating layer 233 is removed. When the planarization process is completed, the upper surface of the second pad 231 may have a curved shape concave toward the second seed layer 235. Also, the upper surface of the second pad 231 may be located at a level lower than a level of the upper surface of the second insulating layer 233. As a result, a second dishing portion dsl may be formed.

Figure 8I:
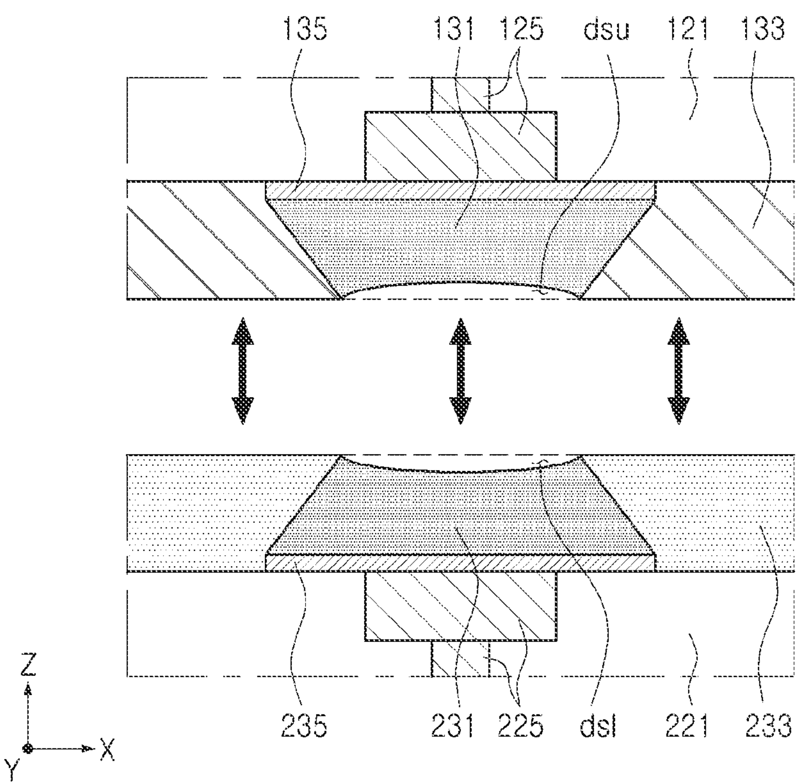

Referring to FIG. 8I, the first pad 131 of the first semiconductor chip 100 may be disposed to face the second pad 231 of the second semiconductor chip 200. Prior to this, the first pad 131 may be formed using (e.g.), the same manufacturing process as was used to manufacture the second pad 231.

Figure 8J:
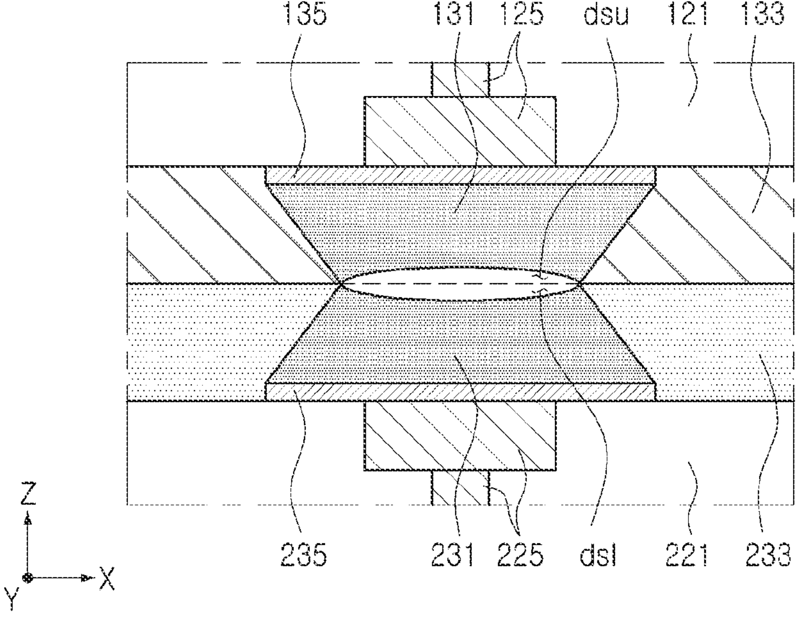
Figure 8K:
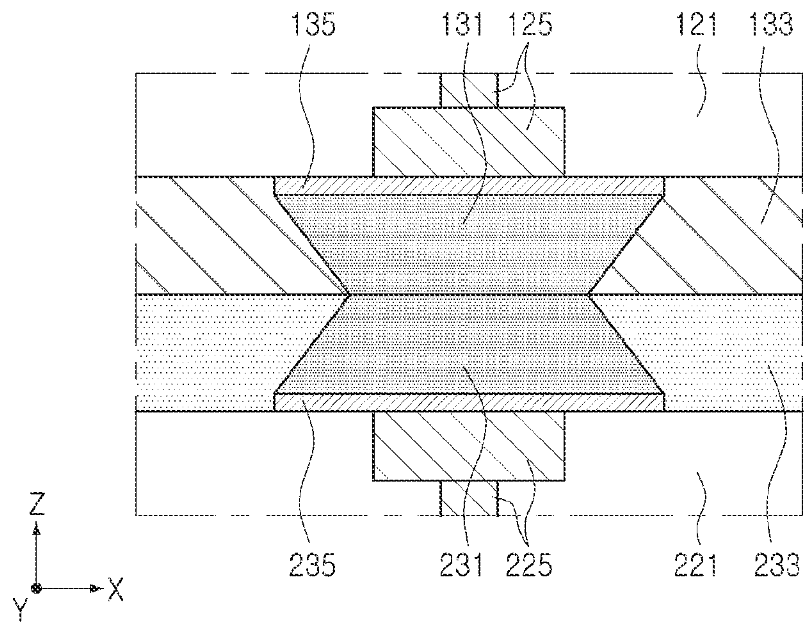

Referring to FIGS. 8J and 8K, the first pad 131 and the second pad 231 may be bonded to each other. In some embodiments, the first pad 131 and the second pad 231 may directly contact each other and be bonded using copper-to-copper bonding technique. An empty space (or void) formed by the first dishing portion dsu and the second dishing portion dsl may exist between the first pad 131 and the second pad 231. However, as the first pad 131 and/or the second pad 231 swell, the void become substantially filled. As described above in relation to certain embodiments, of the inventive concept, the pad volume may be increased through the first pad 131 having a width that increases toward the first substrate 110 and through the second pad 231 having a width that increases toward the second substrate 210. By effectively increasing pad volume(s) associated with the first pad 131 and the second pad 231, swelling may be increased and improved bonding quality may be secured.

Additionally, the first insulating layer 133 and the second insulating layer 233 may contact each other and be bonded using a dielectric-to-dielectric bonding technique. According to various embodiments of the inventive concept, bonding between the first semiconductor chip 100 and the second semiconductor chip 200 may be accomplished through die-to-die bonding, die-to-wafer bonding, and/or wafer-to-wafer bonding.

As described above in relation to several exemplary embodiments of the inventive concept, by bonding a first pad having a width that increases toward the first substrate and a second pad having a width that increases toward the second substrate, a semiconductor package having improved reliability may be provided.

While embodiments have been illustrated and described above, it will be apparent to those skilled in the art that modifications and variations could be made without departing from the scope of the inventive concept as defined by the appended claims.

What is claimed is:

1. A semiconductor package comprising:

a first semiconductor chip stacked on a second semiconductor chip;

the first semiconductor chip including a first substrate, a first insulating layer on a lower surface of the first substrate, and a first pad exposed through the first insulating layer, wherein the first semiconductor chip further includes a first seed layer, wherein an upper surface of the first pad contacts the first seed layer, and wherein an inclined side surface of the first pad is surrounded by the first insulating layer; and the second semiconductor chip including a second substrate, a second insulating layer on an upper surface of the second substrate contacting the first insulating layer, and a second pad exposed through the second insulating layer contacting the first pad, wherein the first pad has a first width that increases toward the first substrate, and the second pad has an inclined side surface and a second width that increases toward the second substrate.

2. The semiconductor package of claim 1, wherein an angle formed between the inclined side surface of the first pad and a lower surface of the first pad is in a range from about 90° to about 110°.

3. The semiconductor package of claim 1, wherein a width of the upper surface of the first pad in in a range from about 1.2 um to about 12 um, and a width of a lower surface of the first pad is in a range from about 1 um to about 10 um.

4. The semiconductor package of claim 1, wherein a height of the first pad is in a range from about 0.5 um to about 2 um.

5. The semiconductor package of claim 1, wherein a width of a lower surface of the first pad is the same as a width of an upper surface of the second pad.

6. The semiconductor package of claim 1, wherein a width of a lower surface of the first pad is greater than a width of an upper surface of the second pad.

7. The semiconductor package of claim 1, wherein a width of a lower surface of the first pad is less than a width of an upper surface of the second pad.

8. The semiconductor package of claim 1, wherein:

the second semiconductor chip further includes a second seed layer contacting a lower surface of the second pad, the first seed layer further includes a first extension portion extending from an end of the first seed layer and interposed between the inclined side surface of the first pad and the first insulating layer, the second seed layer further includes a second extension portion extending from an end of the second seed layer and interposed between the inclined side surface of the second pad and the second insulating layer, and the first extension portion and the second extension portion are in contact with each other.

9. The semiconductor package of claim 1, wherein a lower surface of the first seed layer is disposed at a same level as the upper surface of the first pad, and a width of the upper surface of the first pad is the same as a width of the lower surface of the first seed layer.

10. The semiconductor package of claim 1, wherein the first seed layer has an inclined side surface and a width that increases toward the first substrate.

11. The semiconductor package of claim 1, wherein a lower surface of the first pad has a convex shape downward-facing toward the second substrate, and an upper surface of the second pad has a convex shape upward-facing toward the first substrate.

12. The semiconductor package of claim 11, further comprising:

a groove in a second bonding portion outside a first bonding portion in which the lower surface of the first pad and the upper surface of the second pad contact each other, wherein the first insulating layer and the second insulating layer contact each other in the groove.

13. A semiconductor package comprising:

a first semiconductor chip stacked on a second semiconductor chip;

the first semiconductor chip including a first substrate, a first wiring structure under the first substrate, a first pad connected to the first wiring structure, and a first insulating layer surrounding the first pad, wherein the first semiconductor chip further includes a connection pad surrounded by the first insulating layer, spaced apart from the first pad, having an inclined side surface, and having a width that increases toward the first substrate; and the second semiconductor chip including a second substrate, a second wiring structure on the second substrate, a second pad connected to the second wiring structure and contacting the first pad, and a second insulating layer surrounding the second pad and contacting the first insulating layer, wherein an angle formed between a side surface of the first pad and a lower surface of the first pad is in a range from about 90° to about 110°, and an angle between a side surface of the second pad and an upper surface of the second pad is in a range from about 90° to about 110°.

14. The semiconductor package of claim 13, further comprising:

a redistribution structure electrically connected to the second semiconductor chip; and a vertical connection structure connected between the connection pad and the redistribution structure.

15. The semiconductor package of claim 13, wherein each of the first pad and the second pad has a trapezoidal shape.

16. A semiconductor package comprising:

a first semiconductor chip stacked on a second semiconductor chip;

the first semiconductor chip including a first substrate, a first pad under the first substrate, and a first insulating layer surrounding the first pad; and the second semiconductor chip including a second substrate, a second pad on the second substrate, and a second insulating layer surrounding the second pad and contacting the first insulating layer, wherein the first pad includes a lower surface and an opposing upper surface, the second pad includes an upper surface contacting the lower surface of the first pad and an opposing lower surface, a width of the upper surface of the first pad is greater than a width of the lower surface of the first pad, a width of the lower surface of the second pad is greater than a width of the upper surface of the second pad, and the width of the lower surface of the first pad is different from the width of the upper surface of the second pad.

17. The semiconductor package of claim 16, wherein an angle formed between a side surface of the first pad and a lower surface of the first insulating layer is in a range from about 70° to about 90°.

18. The semiconductor package of claim 17, wherein the first semiconductor chip further includes a first seed layer on the first pad, and an angle formed between a side surface of the first pad and a lower surface of the first seed layer is in a range from about 70° to about 90°.

* * * * *